(12) United States Patent
Lin (10) Patent No.: US 7,738,296 B2
(45) Date of Patent: Jun. 15, 2010

(54) METHOD FOR READING NONVOLATILE MEMORY AT POWER-ON STAGE

(75) Inventor: Yung Feng Lin, Tao-Yuan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 223 days.

(21) Appl. No.: 11/955,715

(22) Filed: Dec. 13, 2007

(65) Prior Publication Data

US 2009/0154250 A1 Jun. 18, 2009

(51) Int. Cl.
*G11C 16/06* (2006.01)

(52) U.S. Cl. ............... 365/185.11; 365/236; 365/185.2; 365/189.09; 365/189.04

(58) Field of Classification Search ............ 365/185.11, 365/236, 185.2, 189.09, 189.04
See application file for complete search history.

(56) References Cited

U.S. PATENT DOCUMENTS

| | | | |
|---|---|---|---|
| 7,064,986 B2 * | 6/2006 | Lee et al. | 365/185.28 |
| 2002/0051385 A1 * | 5/2002 | Hosono et al. | 365/185.22 |
| 2007/0081377 A1 | 4/2007 | Zheng et al. | |

* cited by examiner

*Primary Examiner*—Thong Q Le
(74) *Attorney, Agent, or Firm*—Volpe and Koenig PC (57) ABSTRACT

A method for reading data in a nonvolatile memory at a power-on stage is provided and includes the following steps. Firstly, the data are read through a reference voltage. Next, a failure number is counted when reading the data has a fail result. Next, the reference voltage is adjusted when the failure number reaches a predetermined number. The effect effectively and exactly reading configuration information at a power-on stage is accomplished through the method.

14 Claims, 6 Drawing Sheets

METHOD FOR READING NONVOLATILE MEMORY AT POWER-ON STAGE

FIELD OF THE INVENTION

The present invention relates to a method for reading a nonvolatile memory, and more particularly to a method for reading data in a nonvolatile memory at a power-on stage.

BACKGROUND OF THE INVENTION

A nonvolatile memory refers to a semiconductor device and can continually store the stored data therein when its applied power is off. The nonvolatile memories can be classified as Mask Read-Only Memory (Mask ROM), Programmable Read-Only Memory (PROM), Erasable Programmable Read-Only Memory (EPROM), and Electrically Erasable Programmable Read-Only Memory (EEPROM). Flash Memory can be considered as one type of the Electrically Erasable Programmable Read-Only Memory.

A nonvolatile memory controller can refer to a reference voltage, such as a bandgap reference voltage, and produces a level of a control signal in a word line for performing an operation of programming, erasing, verifying, or reading for a nonvolatile memory. The bandgap reference voltage the magnitude of which, for example, is around 1.25 volts is a reference voltage independent of temperature.

As the bandgap reference voltage can produce a variance due to either a process deviation or different dies, it is needed to correct at a wafer sort stage. One of correction methods is the one selecting a proper correction code by a reference register for making the bandgap reference voltage correct.

As programming, erasing, verifying, or reading a datum in a nonvolatile memory is based on the bandgap reference voltage, an operating voltage of a word line corresponding to a sensed memory cell during a reading operation is set at the center of a state interval between a programming state and an erasing state, so that a reliable reading operation can be accomplished.

A scheme in the prior art for reading a nonvolatile memory at a power-on stage is disclosed in the US Publication No. 2007/0081377 A1. A fuse memory is partitioned into three memory sections, wherein the second memory section stores configuration information. Three data are read from the three memory sections in the given order and compared with three corresponding backup data for performing verifications respectively.

However, as the configuration information is stored in the fuse memory and the correctness of reading is verified at the power-on stage, it is required to additionally add the fuse memory and a control circuit. Therefore, the volume and the complexity are made to increase.

Figure 1:
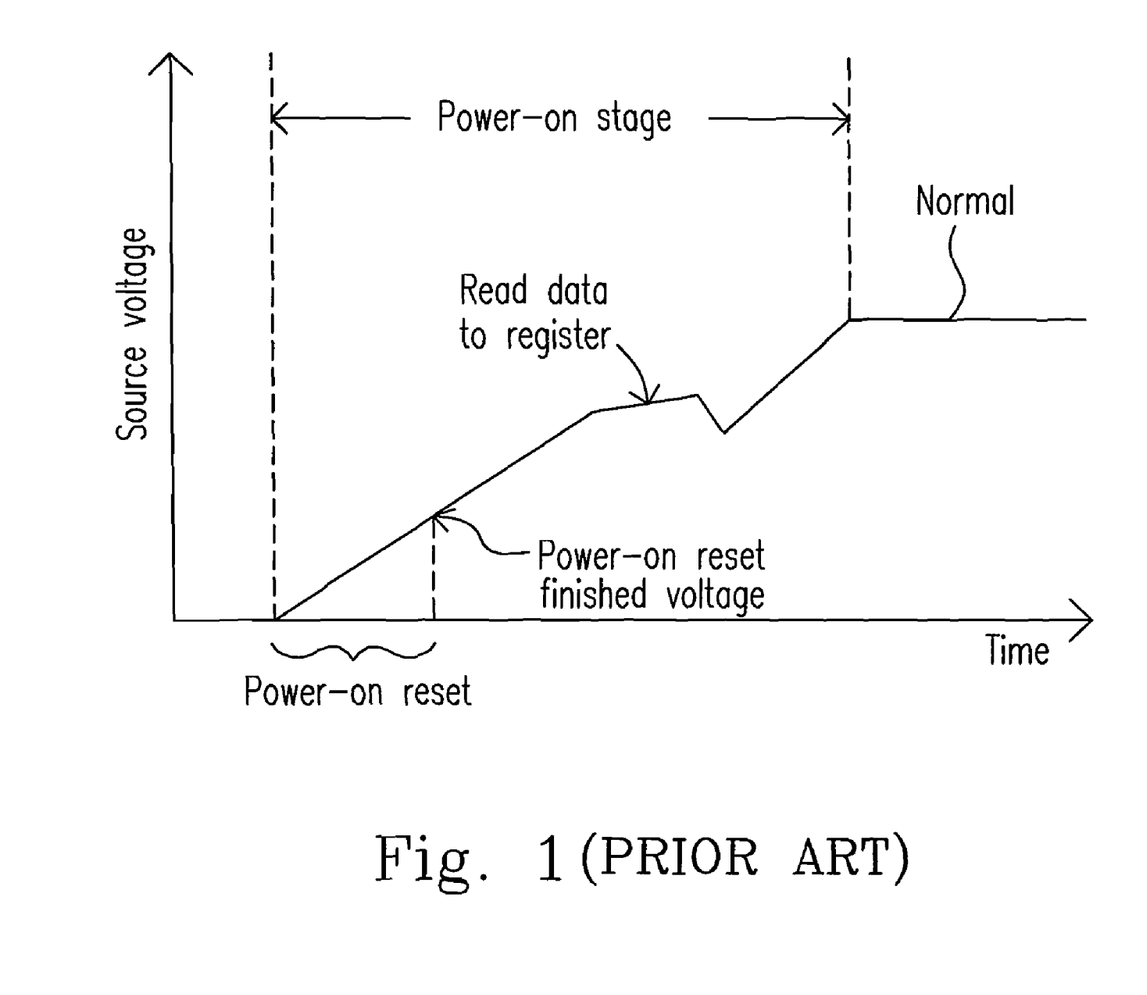
FIG. 1 is a schematic diagram showing a conventional variation between a source voltage and a time for a nonvolatile memory at a power-on stage.

Please refer to FIG. 1, which is a schematic diagram showing a conventional variation between a source voltage and a time for a nonvolatile memory at a power-on stage. As shown, a voltage range from a state, just applying the source voltage to the nonvolatile memory, to a state, the source voltage reaching a power-on reset finished voltage, corresponds to a power-on reset stage. After the power-on reset stage completes, the source voltage is still rising and may have a phenomenon of an unstable variation in the rising process.

In order to speed up that the configuration information programmed in the nonvolatile memory is loaded into an information register, after the source voltage begins to exceed the power-on reset finished voltage, the configuration information is read from the nonvolatile memory immediately and is verified for writing that into the information register. As the rise phenomenon and the disturbance on the source voltage, a potential risk of errors can exist in reading the configuration information.

Figure 2:
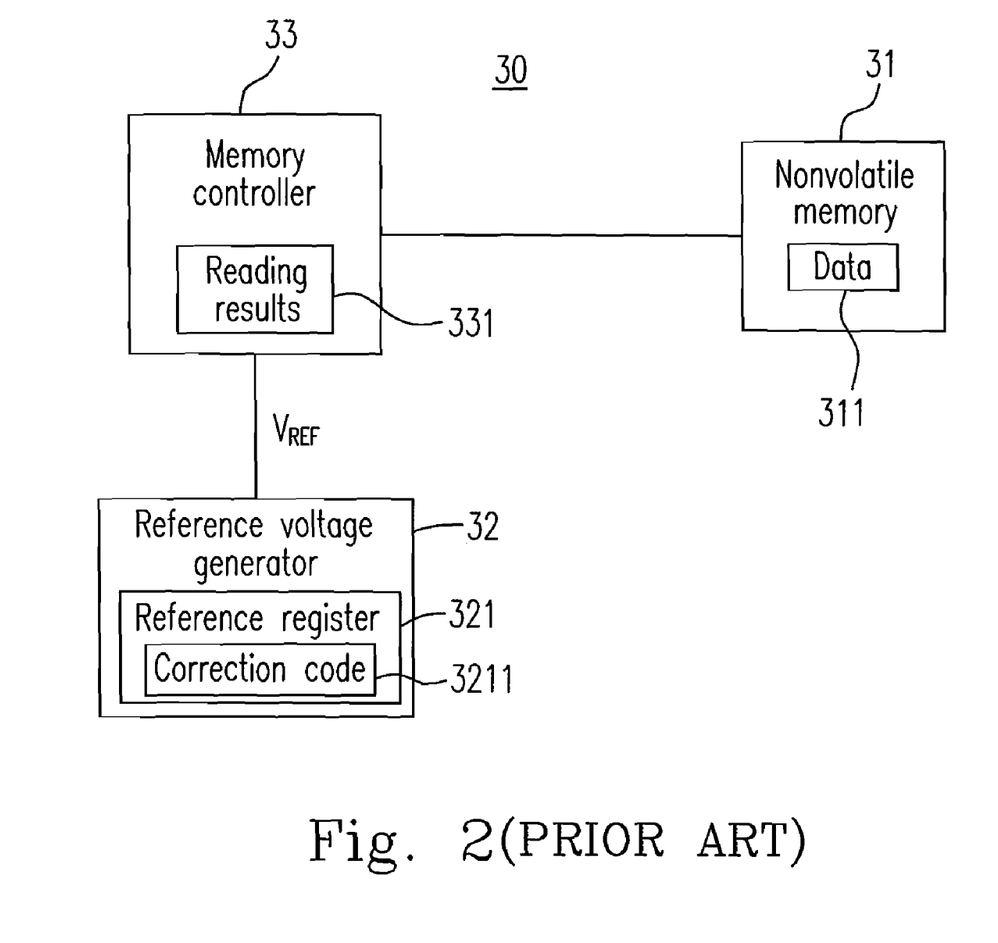
FIG. 2 is a schematic block diagram showing a conventional reading operation in a nonvolatile memory system.

Please refer to FIG. 2, which is a schematic block diagram showing a conventional reading operation in a nonvolatile memory system. In FIG. 2, the nonvolatile memory system 30 includes a nonvolatile memory 31, a reference voltage generator 32, and a memory controller 33. Data 311, such as configuration information, are stored in the nonvolatile memory 31.

The reference voltage generator 32 includes a reference register 321 storing a correction code 3211 preset as a default value and produces a reference voltage $V_{REF}$ provided to the memory controller 33. A common reference voltage generator 32 is a bandgap reference voltage generator generating a reference voltage known as a bandgap reference voltage.

The memory controller 33 receives the reference voltage $V_{REF}$ and reads the data 311 in the nonvolatile memory 31 by the reference voltage $V_{REF}$ for obtaining reading results 331.

Figure 3:
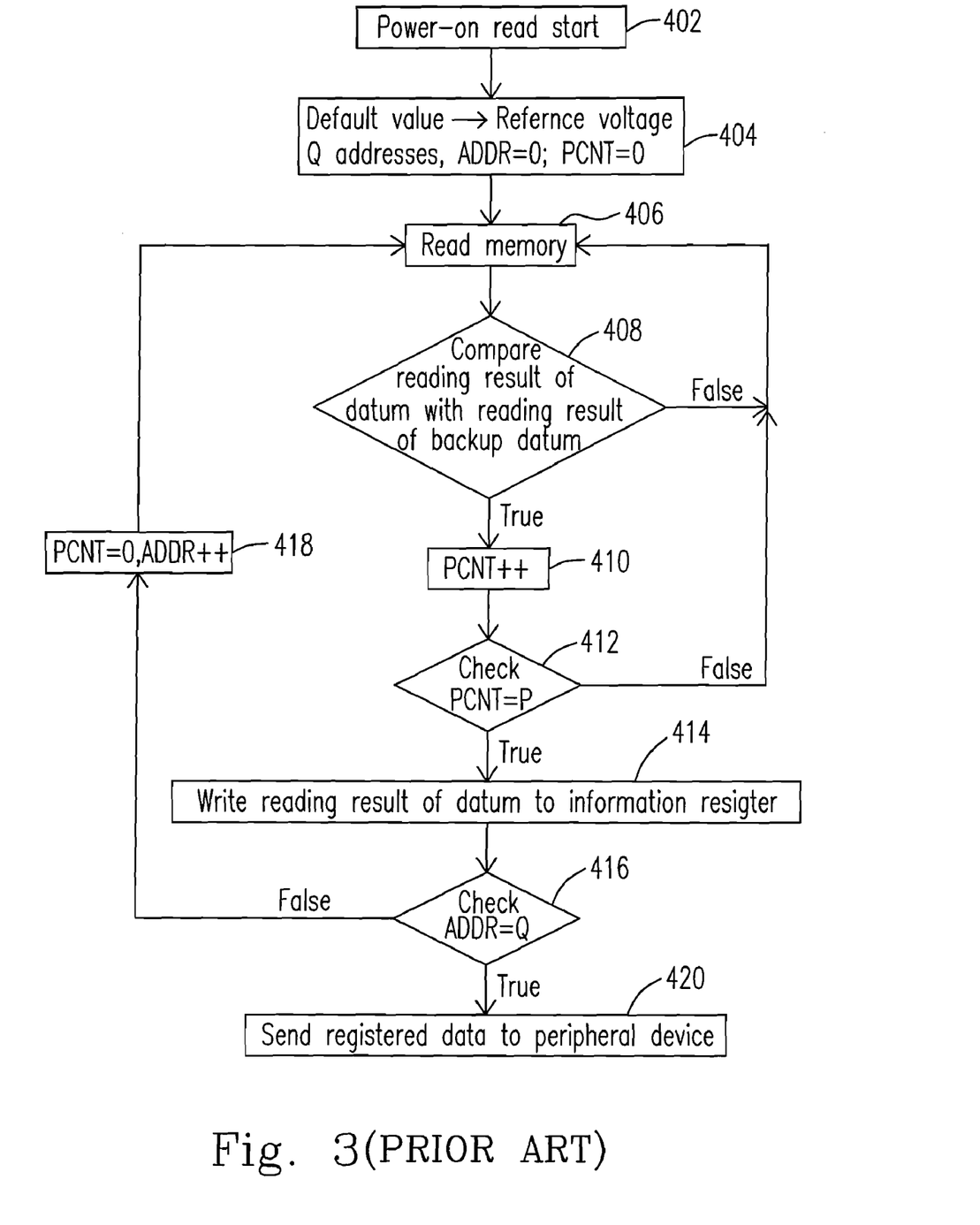
FIG. 3 is a schematic flow diagram showing a conventional procedure for reading data in a nonvolatile memory at a power-on stage.

Please refer to FIG. 3, which is a schematic flow diagram showing a conventional procedure for reading data in a nonvolatile memory at a power-on stage. The read data are, for example, configuration information stored in a flash memory array. A default value is pre-stored in a reference register of a reference voltage generator. In step 402, when a power is turned on, a source voltage applied to the nonvolatile memory begins to rise from zero and a power-on reset stage starts. When the source voltage begins to exceed a power-on reset finished voltage, the power-on reset stage completes and a memory reading of the power-on stage starts.

In step 404, the reference voltage generator produces a reference voltage provided to a memory controller according to the default value. During the reading process, the data in the nonvolatile memory are read in address order. Here, a current address number ADDR being variable is established. It is needed to read the data in total Q addresses, and the data are read from Address 0 (ADDR=0) in order. It is necessary to verify the correctness for the read data. One of verification methods is described as follows. The data in the Q addresses are stored to other Q corresponding addresses as backup data in the nonvolatile memory in advance and corresponding bit levels between the data and the backup data are set inversely. Besides, a success number PCNT being variable representing current times of successful reading is established and is preset as 0.

In step 406, the memory controller reads a first datum, corresponding to a current address of the Q addresses, of the data in the nonvolatile memory by the reference voltage and obtains a first reading result. Afterward, the memory controller similarly reads a first backup datum, corresponding to the first datum, of the backup data at another address in the nonvolatile memory by the reference voltage and obtains a second reading result.

In step 408, the first reading result is compared with the second reading result. An obtained verification result is true when the first reading result and the second reading result are complementary, but is false when the first reading result and the second reading result are not complementary. When the verification result is true, the flow proceeds to step 410. When the verification result is false, the flow goes back to step 406.

In step 410, the success number PCNT is added by 1 for becoming a new success number and the new success number is restored as the success number PCNT.

In step 412, whether the success number PCNT reaches a predetermined number P representing desired times of successful reading for each datum of the data is checked. When the success number PCNT is equal to P, reaching the predetermined number P is true and the flow proceeds to step 414. When the success number PCNT is less than P, reaching the predetermined number P is false and the flow goes back to step 406.

In step 414, the correct reading result of the data with the verification result true is written into an information register, wherein one of devices referring to the information register is a static random access memory.

In step 416, whether the next address exceeds the wanted reading addresses is checked. When the current address number ADDR is equal to Q, exceeding the wanted reading addresses is true and the flow proceeds to step 420. When the current address number ADDR is less than Q, exceeding the wanted reading addresses is false and the flow proceeds to step 418.

In step 418, the current address number ADDR is added by 1 for becoming a new current address number and the new current address number is restored as the current address number ADDR. Moreover, the success number PCNT is reset as 0 and the flow goes back to step 406.

In step 420, the registered data in the information register are sent to a peripheral device requiring the data.

In the aforementioned reading flow, in order to guarantee the read data correct, an error bit check stage including step 406, step 408, step 410 and step 412 is prepared for ensuring the read data reliable.

However, as the default value in the reference register is not the final correction code, the uncorrected bandgap reference voltage can deviate from the objective value (such as 1.25) too much. Therefore, when the source voltage reaches the final stable level, the error bit check stage may not yet end.

Thus, it is necessary to provide a method for exactly reading configuration information in a nonvolatile memory at a power-on stage.

SUMMARY OF THE INVENTION

It is an object of the present invention to provide a method for reading data in a nonvolatile memory. Therefore, the effect effectively and exactly reading configuration information at a power-on stage is accomplished through the method.

It is therefore an aspect of the present invention to provide a method for reading data in a nonvolatile memory. The method includes the following steps. Firstly, the data are read through a reference voltage. Next, a failure number is counted when reading the data has a fail result. Next, the reference voltage is adjusted when the failure number reaches a predetermined number.

It is therefore another aspect of the present invention to provide a method for reading data in a nonvolatile memory. The method includes the following steps. Firstly, the data are read through a reference voltage. Next, the reference voltage is adjusted when reading the data has a fail result.

The above objects and advantages of the present invention will become more readily apparent to those ordinarily skilled in the art after reviewing the following detailed descriptions and accompanying drawings, in which:

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 4:
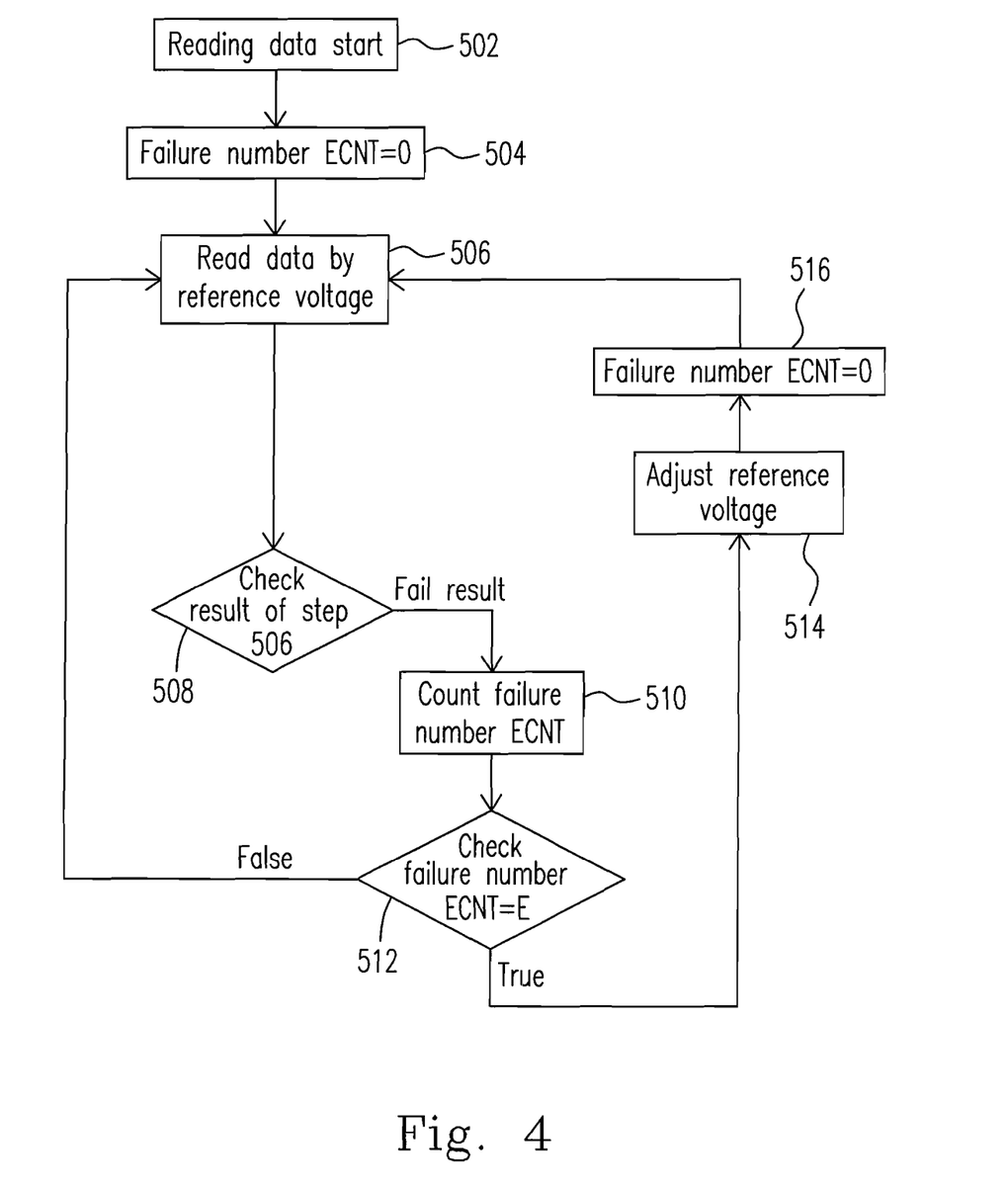
FIG. 4 is a schematic flow diagram showing a procedure for reading data in a nonvolatile memory according to the first embodiment of the present invention.

Please refer to FIG. 4, which is a schematic flow diagram showing a procedure for reading data in a nonvolatile memory according to the first embodiment of the present invention. In step 502, there are two cases to be applied for starting reading. The first case is at a power-on stage; that is, when a source voltage applied to the nonvolatile memory exceeds a power-on reset finished voltage, the flow for reading the data starts. The second case is in a stable state; that is, when the source voltage applied to the nonvolatile memory is normal and stable, the flow for reading the data starts.

In step 504, a failure number ECNT being variable representing current times of fail reading is established and is preset as 0.

In step 506, the data in the nonvolatile memory are read through a first reference voltage. The read data, for example, are configuration information, and the first reference voltage, for example, is a bandgap reference voltage independent of temperature. The read data are verified, and a verification result is obtained.

In step 508, the verification result is checked. When the verification result is false, step 506 has a fail result and the flow proceeds to step 510.

In step 510, the failure number ECNT is counted; that is, the failure number ECNT is added by 1 for becoming a new failure number and the new failure number is restored as the failure number ECNT.

In step 512, whether the failure number ECNT reaches a predetermined number E is checked. When the failure number ECNT is equal to E, reaching the predetermined number E is true and the flow proceeds to step 514. When the failure number ECNT is less than E, reaching the predetermined number E is false and the flow goes back to step 506.

In step 514, the first reference voltage is adjusted as a second reference voltage.

In step 516, the failure number ECNT is reset as 0 and the flow goes back to step 506.

Figure 5:
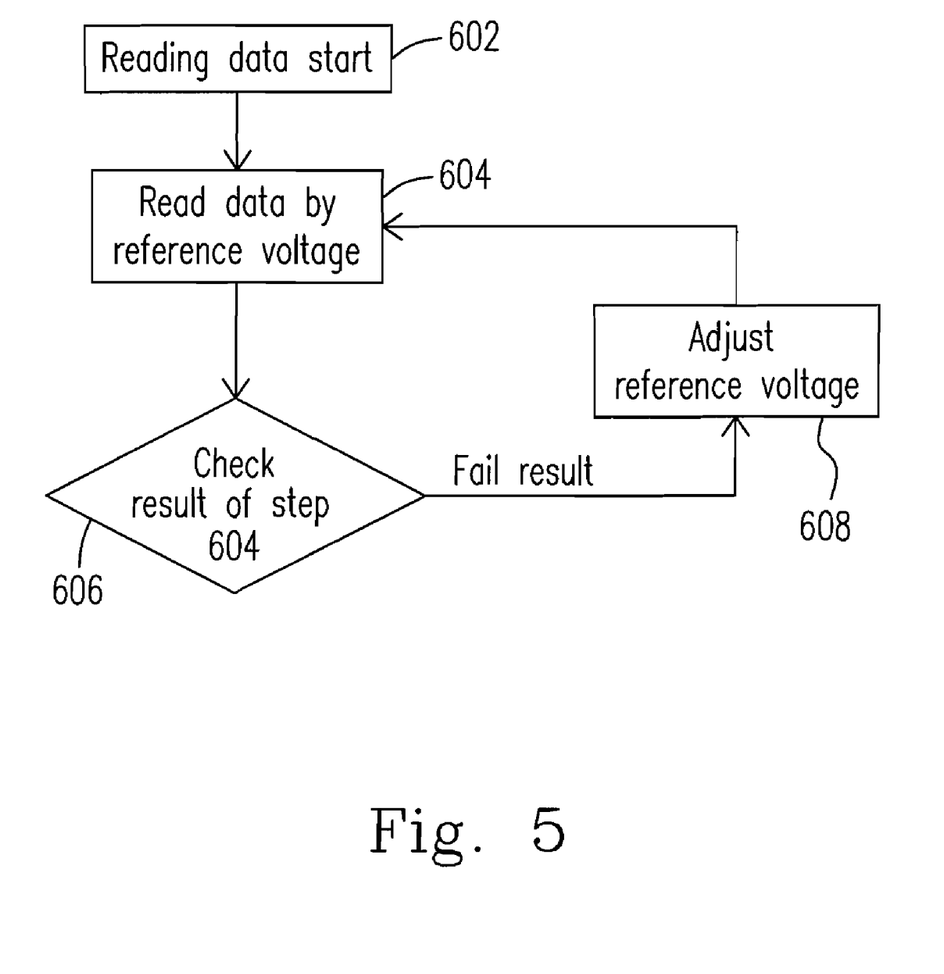
FIG. 5 is a schematic flow diagram showing a procedure for reading data in a nonvolatile memory according to the second embodiment of the present invention.

Please refer to FIG. 5, which is a schematic flow diagram showing a procedure for reading data in a nonvolatile memory according to the second embodiment of the present invention. In step 602, there are two cases to be applied for starting reading. The first case is at a power-on stage; that is, when a source voltage applied to the nonvolatile memory exceeds a power-on reset finished voltage, the flow for reading the data starts. The second case is in a stable state; that is, when the source voltage applied to the nonvolatile memory is normal and stable, the flow for reading the data starts.

In step 604, the data in the nonvolatile memory are read through a first reference voltage. The read data are verified, and a verification result is obtained.

In step 606, the verification result is checked. When the verification result is false, step 604 has a fail result and the flow proceeds to step 608.

In step 608, the first reference voltage is adjusted as a second reference voltage. Afterward, the flow goes back to step 604.

Figure 6:
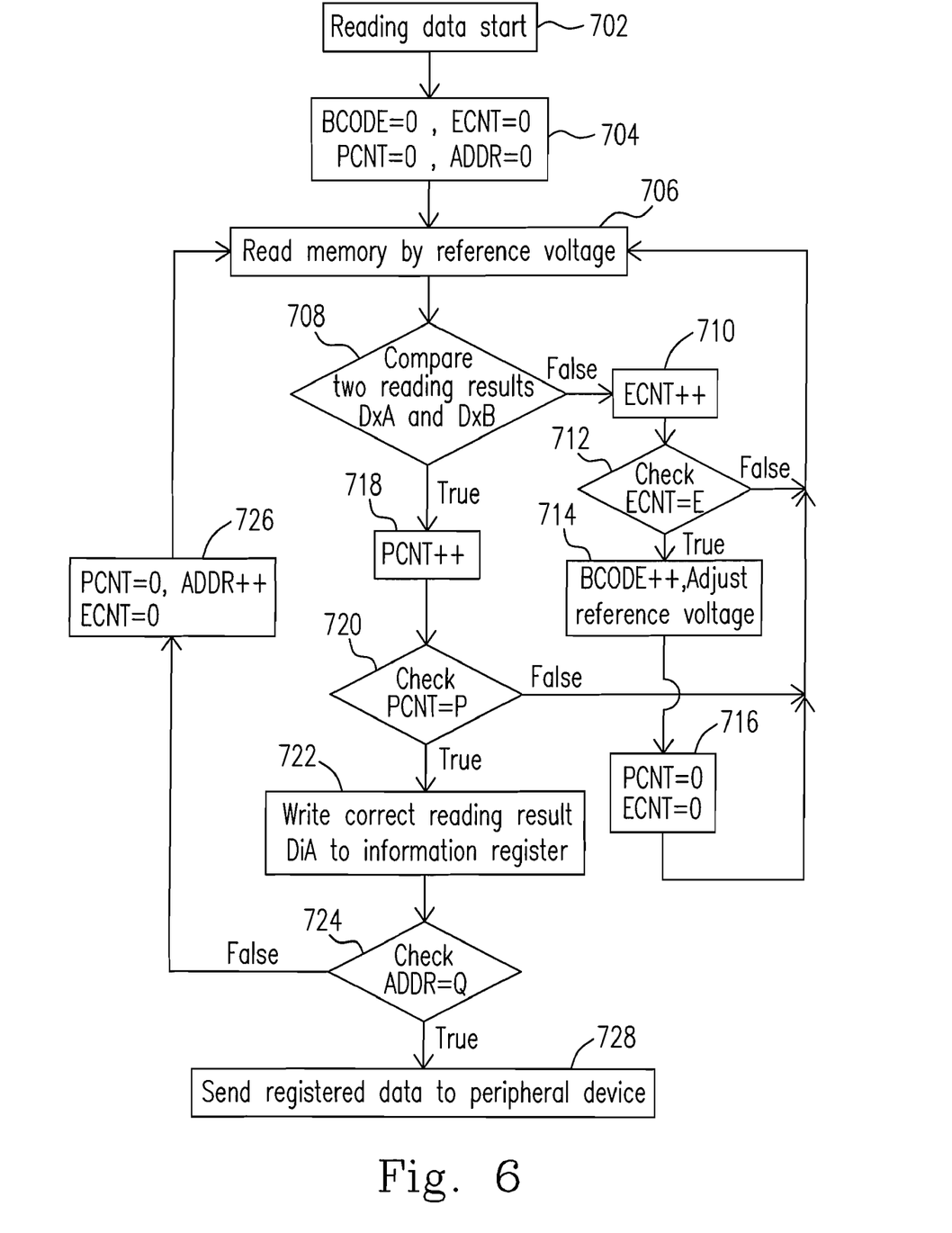
FIG. 6 is a schematic flow diagram showing a procedure for reading data in a nonvolatile memory according to the third embodiment of the present invention.

Please refer to FIG. 6, which is a schematic flow diagram showing a procedure for reading data in a nonvolatile memory according to the third embodiment of the present invention. In step 702, there are two cases to be applied for starting reading. The first case is at a power-on stage; that is, when a source voltage applied to the nonvolatile memory exceeds a power-on reset finished voltage, the flow for reading the data starts. The second case is in a stable state; that is, when the source voltage applied to the nonvolatile memory is normal and stable, the flow for reading the data starts.

In step 704, a code BCODE in a reference register of a reference voltage generator is adjustable and has a default value 0. The reference voltage generator produces a reference voltage provided to a memory controller according to the code BCODE. During the reading process, the data in the nonvolatile memory are read in address order. Here, a current address number ADDR being variable is established. It is needed to read the data in total Q addresses, and the data are read from Address 0 (ADDR=0) in order. It is necessary to verify the correctness for the read data. One of verification methods is described as follows. The data in the Q addresses are stored to other Q corresponding addresses as backup data in the nonvolatile memory in advance and corresponding bit levels between the data and the backup data are set inversely. Besides, a success number PCNT being variable representing current times of successful reading is established and is preset as 0. A failure number ECNT being variable representing current times of fail reading is established and is preset as 0.

In step 706, the memory controller reads a first datum, corresponding to a current address of the Q addresses, of the data in the nonvolatile memory by the reference voltage and obtains a first reading result D1A. Afterward, the memory controller similarly reads a first backup datum, corresponding to the first datum, of the backup data at a corresponding address in the nonvolatile memory by the reference voltage and obtains a second reading result D1B.

In step 708, the first reading result D1A is compared with the second reading result D1B. An obtained verification result is true when the first reading result D1A and the second reading result D1B are complementary, but is false when the two reading results D1A and D1B are not complementary. When the verification result is true, the flow proceeds to step 718. When the verification result is false, the flow proceeds to step 710.

In step 710, the failure number ECNT is added by 1 for becoming a new failure number and the new failure number is restored as the failure number ECNT.

In step 712, whether the failure number ECNT reaches a predetermined number E representing threshold times of fail reading for each datum of the data is checked. When the failure number ECNT is equal to E, reaching the predetermined number E is true and the flow proceeds to step 714. When the failure number ECNT is less than E, reaching the predetermined number E is false and the flow goes back to step 706.

In step 714, the code BCODE is added by 1 for becoming an adjusting value, and the adjusting value is restored as the code BCODE. The reference voltage generator produces a new reference voltage provided to the memory controller according to the code BCODE, and the new reference voltage is renamed as the reference voltage.

In step 716, the success number PCNT is reset as 0 and the failure number ECNT is reset as 0. Afterward, the flow goes back to step 706.

In step 718, the success umber PCNT is added by 1 for becoming a new success number, and the new success number is restored as the success number PCNT.

In step 720, whether the success number PCNT reaches a predetermined number P representing desired times of successful reading for each datum of the data is checked. When the success number PCNT is equal to P, reaching the predetermined number P is true and the flow proceeds to step 722, wherein the predetermined number P is not less than the predetermined number E. When the success number PCNT is less than P, reaching the predetermined number P is false and the flow goes back to step 706.

When the success number PCNT is less than P and it is in step 706 again, the memory controller reads the first datum, corresponding to the current address of the Q addresses, of the data by the reference voltage and obtains a third reading result D2A. Afterward, the memory controller similarly reads the first backup datum of the backup data at the corresponding address by the reference voltage and obtains a fourth reading result D2B.

In step 722, the correct reading result DiA of the data with the verification result true is written into an information register.

In step 724, whether the next address exceeds the wanted reading addresses is checked. When the current address number ADDR is equal to Q, exceeding the wanted reading addresses is true and the flow proceeds to step 728. When the current address number ADDR is less than Q, exceeding the wanted reading addresses is false and the flow proceeds to step 726.

In step 726, the current address number ADDR is added by 1 for becoming a new current address number, and the new current address number is restored as the current address number ADDR. Moreover, the success number PCNT is reset as 0 and the failure number ECNT is reset as 0. Afterward, the flow goes back to step 706.

In step 728, the registered data in the information register are sent to a peripheral device requiring the data.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for reading data in a nonvolatile memory, comprising steps of:
   (a) reading the data by a reference voltage;
   (b) counting a failure number when the step of reading has a fail result; and
   (c) adjusting the reference voltage when the failure number reaches a first predetermined number, wherein a source voltage applied to the nonvolatile memory exceeds a power-on reset finished voltage.

2. The method of claim 1, wherein the data are configuration information and the step of reading happens at a power-on stage.

3. The method of claim 1, further comprising steps of:
   (e) obtaining a first reading result by reading a first datum of the data;

(f) obtaining a second reading result by reading a second datum, corresponding to the first datum, of backup data corresponding to the data;

(g) obtaining a verification result by comparing the first reading result with the second reading result, wherein the step of reading has the fail result when the verification result is false;

(h) counting a success number when the verification result is true; and (i) repeating the step (e) by reading the first datum, the step (f) by reading the second datum, the step (g), the step (h), and the step (b), when the success number does not reach a second predetermined number, wherein the second predetermined number is not less than the first predetermined number.

4. The method of claim 3, further comprising a step of:
presetting corresponding bit levels between the data and the backup data inversely, wherein the verification result is false when the first reading result and the second reading result are not complementary.

5. The method of claim 1, wherein the step of adjusting further comprising steps of:
obtaining the reference voltage according to a default value in a reference register;
replacing the default value with an adjusting value when the failure number reaches the first predetermined number; and
adjusting the reference voltage as a new reference voltage according to the adjusting value.

6. The method of claim 1, wherein the reference voltage is a bandgap reference voltage.

7. The method of claim 1, wherein the nonvolatile memory further comprises a flash memory.

8. A method for reading data in a nonvolatile memory, comprising steps of:
reading the data by a reference voltage; and
adjusting the reference voltage when the step of reading has a fail result, wherein a source voltage applied to the nonvolatile memory exceeds a power-on reset finished voltage.

9. The method of claim 8, wherein the data are configuration information and the step of reading happens at a power-on stage.

10. The method of claim 8, further comprising steps of:
(a) obtaining a first reading result by reading a first datum of the data;
(b) obtaining a second reading result by reading a second datum, corresponding to the first datum, of backup data corresponding to the data;
(c) obtaining a verification result by comparing the first reading result with the second reading result;
(d) counting a success number when the verification result is true;
(e) counting a failure number when the verification result is false, wherein the step of reading has the fail result when the failure number reaches a first predetermined number; and
(f) repeating the step (a) by reading the first datum, the step (b) by reading the second datum, the step (c), the step (d), and the step (e), when the success number does not reach a second predetermined number, wherein the second predetermined number is not less than the first predetermined number.

11. The method of claim 10, further comprising a step of:
presetting corresponding bit levels between the data and the backup data inversely, wherein the verification result is false when the first reading result and the second reading result are not complementary.

12. The method of claim 8, wherein the step of adjusting further comprises steps of:
obtaining the reference voltage according to a default value in a reference register;
replacing the default value with an adjusting value when the step of reading has the fail result; and
adjusting the reference voltage as a new reference voltage according to the adjusting value.

13. The method of claim 8, wherein the reference voltage is a bandgap reference voltage.

14. The method of claim 8, wherein the nonvolatile memory further comprises a flash memory.

* * * * *